US012713714B2

(12) United States Patent
Sharma et al.

(10) Patent No.: US 12,713,714 B2
(45) Date of Patent: Aug. 18, 2026

(54) PIE PHOTODETECTOR

(71) Applicant: Cisco Technology, Inc., San Jose, CA (US)

(72) Inventors: Rajat Sharma, Pasadena, CA (US); Attila Mekis, Carlsbad, CA (US); Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 585 days.

(21) Appl. No.: 18/156,301

(22) Filed: Jan. 18, 2023

(65) Prior Publication Data

US 2024/0243214 A1 Jul. 18, 2024

(51) Int. Cl.
*H10F 30/225* (2025.01)
*H10F 77/40* (2025.01)

(52) U.S. Cl.
CPC ....... *H10F 30/2255* (2025.01); *H10F 77/407* (2025.01); *H10F 77/413* (2025.01)

(58) Field of Classification Search
CPC .. H10F 30/2255; H10F 77/407; H10F 77/413; H10F 30/221; H10F 77/148; H10F 77/147; G02B 6/12004; G02B 2006/12123
See application file for complete search history.

(56) References Cited

U.S. PATENT DOCUMENTS 7,397,101 B1 * 7/2008 Masini .................. H10F 30/223 257/656
2007/0031080 A1 * 2/2007 Liu ......................... G02F 1/025 385/3
2010/0080504 A1 * 4/2010 Shetrit .................. G02F 1/2257 385/14
2011/0206313 A1 * 8/2011 Dong ...................... G02F 1/025 385/2
2015/0219773 A1 8/2015 Zhang et al.
2016/0211402 A1 7/2016 Joo et al.
2020/0028000 A1 * 1/2020 Wang ................... G02B 6/4204
2020/0252126 A1 8/2020 Parker et al.
2020/0393618 A1 * 12/2020 Novack ................ G02B 6/1225

(Continued)

OTHER PUBLICATIONS

Dongjun Seo et al., "Design of Microdisk-Shaped GE ON SI Photodetector with Recess Structure for Refractive-Index Sensing," MDPI, Dated Nov. 29, 2019, pp. 1-10.

*Primary Examiner* — Bitew A Dinke
(74) *Attorney, Agent, or Firm* — Patterson + Sheridan, LLP

(57) ABSTRACT

A photodetector and method of making a photodetector are disclosed. An apparatus includes a semiconductor disk, a first doped region, and a first absorption region. The first doped region is disposed within the semiconductor disk such that the first doped region extends across a center of the semiconductor disk. The first doped region has a first doping type. The first absorption region is disposed on the first doped region such that a portion of the first doped region is positioned between the center of the semiconductor disk and the first absorption region along a radius of the semiconductor disk. The first absorption region includes a second doped region with a second doping type different from the first doping type. The first absorption region is arranged to absorb an optical signal as the optical signal travels along an inner circumference of the semiconductor disk.

10 Claims, 13 Drawing Sheets

(56) References Cited

U.S. PATENT DOCUMENTS

| | | | | |
|---|---|---|---|---|
| 2021/0013356 | A1 | 1/2021 | Huang et al. | |
| 2021/0066529 | A1* | 3/2021 | Lu | H10F 39/802 |
| 2021/0175384 | A1* | 6/2021 | Yu | H10F 77/122 |
| 2021/0313306 | A1* | 10/2021 | Hon | G02B 6/12007 |
| 2022/0013680 | A1* | 1/2022 | Srinivasan | H10F 30/225 |
| 2022/0181378 | A1* | 6/2022 | Yen-Cheng | H10F 77/933 |
| 2023/0207719 | A1* | 6/2023 | Chien | H10F 30/225<br>257/186 |
| 2025/0015211 | A1* | 1/2025 | Chen | H10F 30/22 |

* cited by examiner 102
202
208
208
208
204
206

102
202
208
206
208
204
206
208

102
208
206
208
204
206
208
202

102
202
204
206
208
208
208

102
202
204
206
208
208

102
202
204
206
208
208

202
204
Absorption Region
206
Absorption Region
206
Doped Region
Semiconductor Disk

PIE PHOTODETECTOR

TECHNICAL FIELD

Embodiments presented in this disclosure generally relate to photodetectors.

BACKGROUND

Optical transceivers may include a photodetector at the receiver end that converts an optical signal into an electric signal. Ever increasing data needs push transceivers to support higher bandwidths. Realizing a low-footprint, high responsivity integrated photodetector at the receiver end while retaining high bandwidth remains a challenge.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting, other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
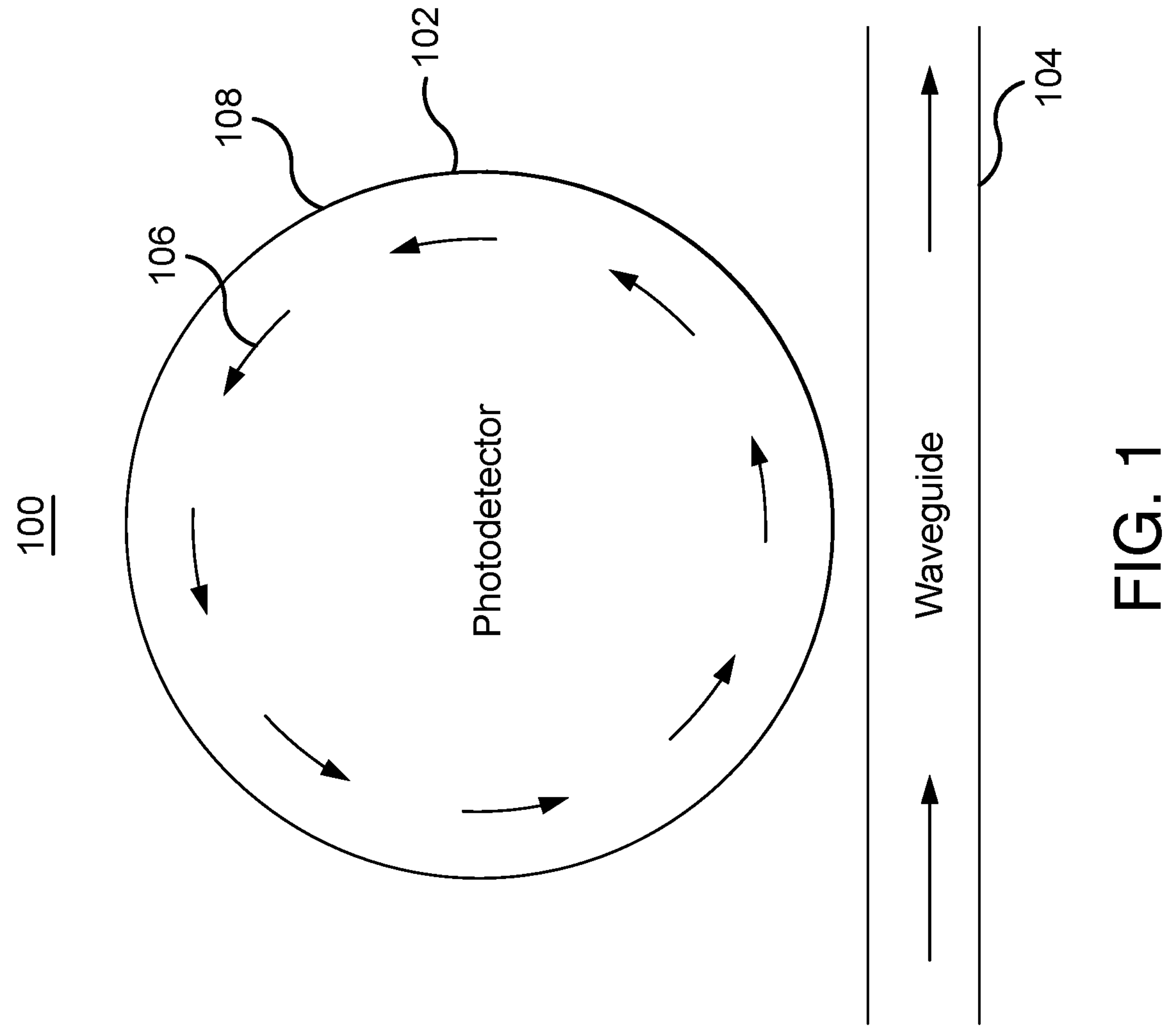
FIG. 1 illustrates an example system.

According to an embodiment, an apparatus includes a semiconductor disk, a first doped region, and a first absorption region. The first doped region is disposed within the semiconductor disk such that the first doped region extends across a center of the semiconductor disk. The first doped region has a first doping type. The first absorption region is disposed on the first doped region such that a portion of the first doped region is positioned between the center of the semiconductor disk and the first absorption region along a radius of the semiconductor disk. The first absorption region includes a second doped region with a second doping type different from the first doping type. The first absorption region is arranged to absorb an optical signal as the optical signal travels along an inner circumference of the semiconductor disk.

According to another embodiment, a method includes doping a semiconductor disk to produce a first doped region disposed within the semiconductor disk. The first doped region extends across a center of the semiconductor disk. The first doped region has a first doping type. The method also includes etching the first doped region to produce a first cavity in the first doped region and positioning a first absorption region in the first cavity such that a portion of the first doped region is positioned between the center of the semiconductor disk and the first absorption region along a radius of the semiconductor disk. The method further includes doping the first absorption region to produce a second doped region in the first absorption region. The second doped region has a second doping type different from the first doping type. The first absorption region is arranged to absorb an optical signal as the optical signal travels along an inner circumference of the semiconductor disk.

According to another embodiment, an apparatus includes a semiconductor disk, a doped region, a first absorption region, and a second absorption region. The doped region is disposed within the semiconductor disk such that the doped region extends across a center of the semiconductor disk. The first absorption region is disposed on a first side of the doped region. The second absorption region is disposed on a second side the doped region opposite the first side. The first and second absorption regions are arranged to absorb an optical signal as the optical signal travels along an inner circumference of the semiconductor disk.

EXAMPLE EMBODIMENTS

Optical transceivers may include a photodiode at the receiver end that converts an optical signal into an electric signal. Ever increasing data needs push transceivers to support higher bandwidths. Improvements to the photodetector may allow the transceiver to support higher bandwidths.

The present disclosure describes a photodetector with a pie arrangement. Generally, an optical signal may couple into the photodetector (e.g., directly or evanescently) and travel around an inner circumference of the photodetector. One or more absorption regions are positioned along the inner circumference and absorb the optical signal as the optical signal travels around the inner circumference. In certain embodiments, this structure allows the photodetector to support higher bandwidths in an optical transceiver.

FIG. 1 illustrates an example system 100. As seen in FIG. 1, the system 100 includes a photodetector 102 and a waveguide 104. Generally, the waveguide 104 carries an optical signal to the photodetector 102. In the example of FIG. 1, the optical signal in the waveguide 104 evanescently couples into the photodetector 102. In some embodiments, the waveguide 104 may directly couple to the photodetector 102, and the optical signal in the waveguide 104 may travel directly from the waveguide 104 into the photodetector 102, instead of evanescently coupling into the photodetector 102.

As seen in FIG. 1, when the optical signal travels into the photodetector 102, the optical signal travels around an inner circumference 106 of the photodetector 102. The photodetector 102 may have a circumference 108 that defines the physical boundary of the photodetector 102. The inner circumference 106 defines a path on the interior of the photodetector 102 that is concentric with the circumference 108 of the photodetector 102. The optical signal in the photodetector 102 travels along the inner circumference 106. One or more absorption regions may be positioned along the optical signal's path in the photodetector 102. The absorption regions may absorb the optical signal as the optical signal travels along the inner circumference 106. The photodetector 102 may produce an electric signal that corresponds to the amount of light or optical signal absorbed by the absorption regions of the photodetector 102.

FIGS. 2A through 2M illustrate example configurations for the photodetector 102 in the system 100 of FIG. 1. Generally, these configurations may include one or more absorption regions positioned along the inner circumference 106 of the photodetector 102. The absorption regions are positioned next to or adjacent to a doped region. The doped region is typically positioned about the radial center of the photodetector 102. The absorption regions are positioned such that a portion of the doped region is positioned between the absorption region and the radial center of the photodetector 102 along a radius of the photodetector 102. In this manner, the absorption regions absorb an optical signal as the optical signal travels along the inner circumference 106 of the photodetector 102, which may allow the photodetector 102 to support higher bandwidths in an optical transceiver.

Figures 2A, 2B, 2C:
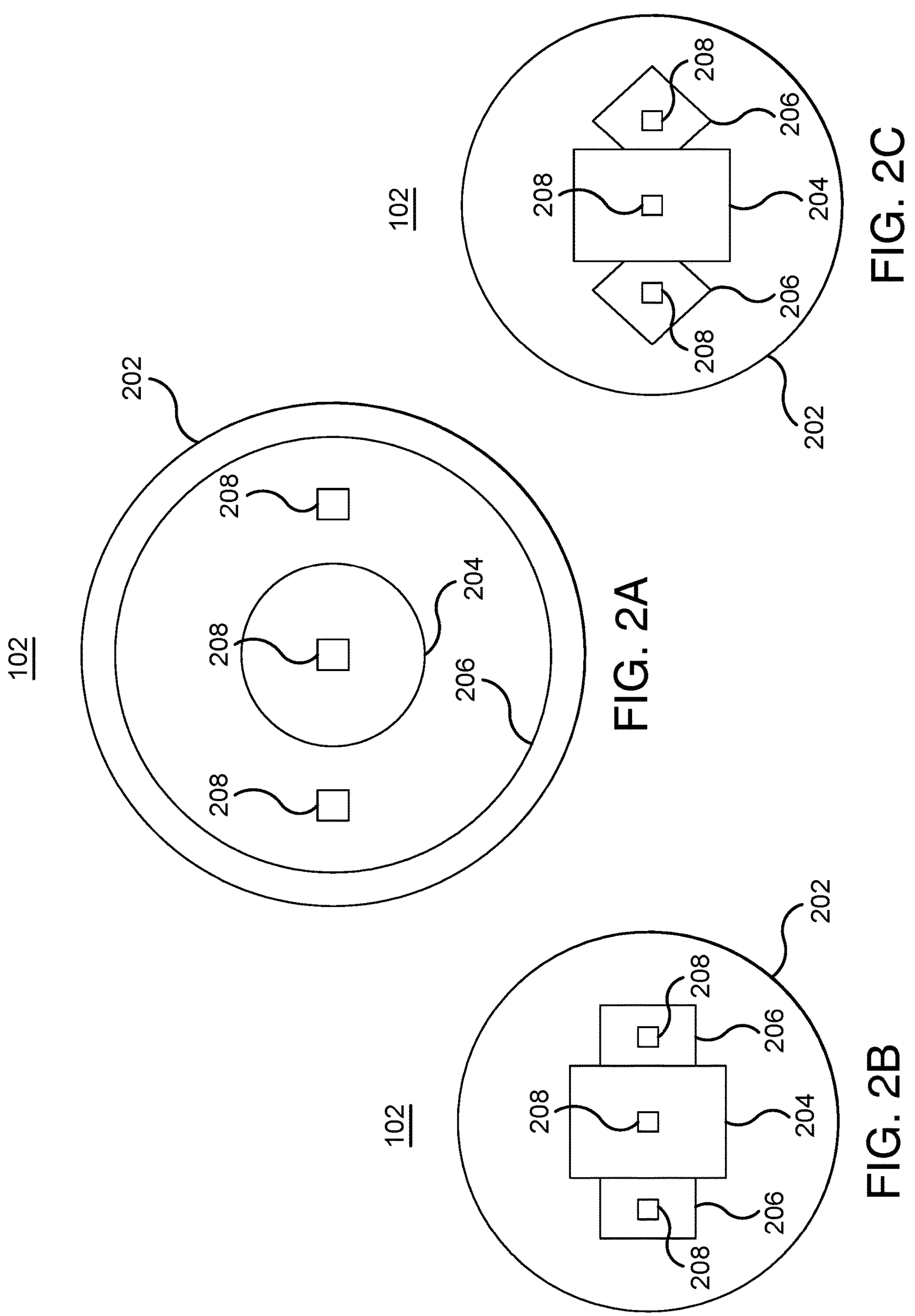
FIGS. 2A through 2M illustrate example photodetectors in the system of FIG. 1.

FIG. 2A illustrates an example configuration of the photodetector 102 of the system 100 of FIG. 1. FIG. 2A provides a top-down view of the photodetector 102. As seen in FIG. 2A, the photodetector 102 includes a semiconductor disk 202, a doped region 204, an absorption region 206, and metal contacts 208. The semiconductor disk 202 may be a substrate that provides foundational or structural support for the other components of the photodetector 102. In some embodiments, the semiconductor disk 202 includes silicon. The other components of the photodetector 102 may be formed on or above the semiconductor disk 202 in the stack. In the example of FIG. 2A, the silicon disk is circular or oval shaped, but the semiconductor disk 202 in the configurations of FIGS. 2A through 2M may be any suitable shape that accommodates the other components of the photodetector 102.

The photodetector 102 includes a doped region 204. In some embodiments, the doped region 204 is an n-type doped region. As see in FIG. 2A, the doped region 204 may be positioned near or on the center of the semiconductor disk 202. The doped region 204 may be circular or oval shaped. In some embodiments, the doped region 204 may be formed by doping a region of the semiconductor disk 202. This region may extend across the center of the semiconductor disk 202, and the doped region 204 may be concentric with the outer boundary of the semiconductor disk 202. Thus, the doped region 204 may be formed to resemble a disk that is concentric with the semiconductor disk 202.

The absorption region 206 may be formed on or within the doped region 204. In some embodiments, the absorption region 206 includes germanium. As seen in FIG. 2A, the absorption region 206 may be formed on top of the doped region 204. The absorption region may be circular or oval shaped. The absorption region 206 may define a central cavity through which a portion of the doped region 204 extends. As a result, the portion of the doped region 204 may be positioned between the center of the semiconductor disk 202 and the absorption region 206 along a radius of the semiconductor disk 202. Thus, the portion of the doped region 204 may extend across the radial center of the semiconductor disk 202 and be exposed. The absorption region 206 may surround the portion of the doped region 204. When viewed from the top-down, the doped region 204 may appear central on the semiconductor disk 202 relative to the absorption region 206. As seen in FIG. 2A, the absorption region 206 may be positioned along an inner circumference of the semiconductor disk 202. When the optical signal travels along the inner circumference, the optical signal may also travel along the absorption region 206. The absorption region 206 absorbs the optical signal as the optical signal travels along the absorption region 206.

One or more metal contacts 208 may be formed on the doped region 204 and the absorption region 206. In the example of FIG. 2A, a metal contact 208 is formed on the doped region 204 near the center of the semiconductor disk 202. Two other metal contacts 208 are formed on the absorption region 206. When the absorption region 206 absorbs the optical signal, negatively charged electrons may be separated from positively charged holes in the absorption region 206. The metal contacts 208 may be used to extract the electrons and holes, which produces an electric current between the metal contacts 208. In this manner, the photodetector 102 converts the optical signal into an electric signal.

FIG. 2B illustrates an example configuration of the photodetector 102 in the system 100 of FIG. 1. FIG. 2B provides a top-down view of the photodetector 102. As seen in FIG. 2B, the photodetector 102 includes the semiconductor disk 202, the doped region 204, the absorption regions 206, and the metal contacts 208. The doped region 204 may be an n-type doped region formed in or on the semiconductor disk 202 (e.g., a silicon disk). In the example of FIG. 2B, the doped region 204 may be rectangular in shape and extend across the center of the semiconductor disk 202.

Two absorption regions 206 (e.g., germanium regions) may be formed on the sides of the doped region 204. The absorption regions 206 may be rectangular in shape, like the doped region 204. In the example of FIG. 2B, the absorption regions 206 are positioned laterally with respect to the doped region 204. The doped region 204 may be positioned between the two absorption regions 206, such that portions of the doped region 204 are positioned between the center of the semiconductor disk 202 and the absorption regions 206 along a radius of the semiconductor disk 202. Thus, the absorption regions 206 are positioned on opposite sides of the doped region 204. The absorption regions 206 may be positioned along an inner circumference of the semiconductor disk 202, and the absorption region 206 may absorb an optical signal as the optical signal travels along the inner circumference of the semiconductor disk 202.

Metal contacts 208 are formed on the doped region 204 and the absorption regions 206. The metal contacts 208 may allow extraction of the negatively charged electrons and positively charged holes from the doped region 204 and the absorption regions 206 to produce an electric signal.

FIG. 2C illustrates an example configuration of the photodetector 102 in the system 100 of FIG. 1. FIG. 2C provides a top-down view of the photodetector 102. As seen in FIG. 2C, the photodetector 102 includes a semiconductor disk 202, a doped region 204, two absorption regions 206, and metal contacts 208. The doped region 204 may be an n-type doped region formed in or on the semiconductor disk 202 (e.g., a silicon disk). The doped region 204 may extend across a radial center of the semiconductor disk 202. In the example of FIG. 2C, the doped region 204 may be rectangular shaped or square shaped.

Two absorption regions 206 are formed next or adjacent to the doped region 204. The doped region 204 may be positioned between the two absorption regions 206. As a result, portions of the doped region 204 are positioned between the center of the semiconductor disk 202 and the absorption regions 206 along a radius of the semiconductor disk 202. As seen in FIG. 2C. the absorption regions 206 may be diamond or square-shaped. Thus, the absorption regions 206 are positioned on opposite sides of the doped region 204. The absorption regions 206 are positioned on an inner circumference of the semiconductor disk 202, and the absorption regions 206 absorb an optical signal that travels along the inner circumference of the semiconductor disk 202.

Metal contacts 208 are formed on the doped region 204 and the absorption regions 206. The metal contacts 208 allow extraction of negatively charged electrons and positively charged holes from the doped region 204 and the absorption regions 206 to produce an electric signal.

Figures 2D, 2E, 2F:
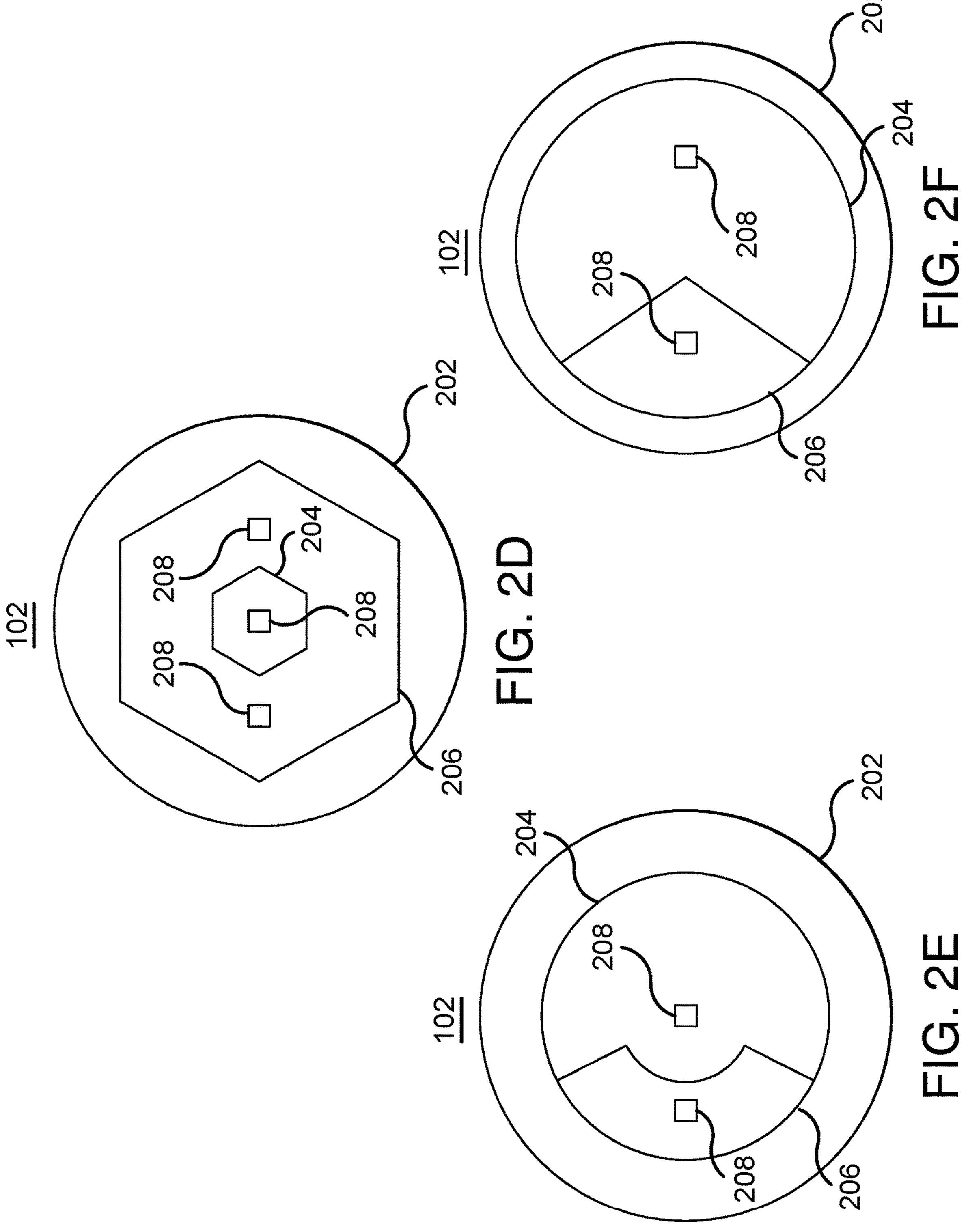

FIG. 2D illustrates an example configuration of the photodetector 102 in the system 100 of FIG. 1. FIG. 2D provides a top-down view of the photodetector 102. As seen in FIG. 2D, the photodetector 102 includes the semiconductor disk 202, the doped region 204, the absorption region 206, and the metal contacts 208. The doped region 204 may be an n-type doped region formed in or on the semiconductor disk 202 (e.g., a silicon disk). The doped region 204 may extend across a radial center of the semiconductor disk 202. As seen in FIG. 2D, the doped region 204 may be hexagonal shaped.

The absorption region 206 may be positioned on or in the doped region 204. The absorption region 206 may define a central cavity through which the doped region 204 may extend. As a result, portions of the doped region 204 are positioned between the center of the semiconductor disk 202, and the absorption region 206, along a radius of the semiconductor disk 202. As seen in FIG. 2D, the absorption region 206 may be hexagonal in shape and concentric with the doped region 204. Thus, the portion of the doped region 204 may extend across the radial center of the semiconductor disk 202 and be exposed. The absorption region 206 may surround the portion of the doped region 204. The absorption region 206 may be formed along an inner circumference of the semiconductor disk 202, and the absorption region 206 may absorb an optical signal that travels along the inner circumference of the semiconductor disk 202.

Metal contacts 208 are formed on the doped region 204 and the absorption region 206. The metal contacts 208 may allow for extraction of negative charged electrons and positively charged holes from the doped region 204 and the absorption region 206 to produce an electric signal.

FIG. 2E illustrates an example configuration of the photodetector 102 in the system 100 of FIG. 1. FIG. 2E provides a top-down view of the photodetector 102. As seen in FIG. 2E, the photodetector 102 includes the semiconductor disk 202, the doped region 204, the absorption region 206, and metal contacts 208. The doped region 204 may be an n-type doped region formed on or in the semiconductor disk 202. The doped region 204 may extend across a radial center of the semiconductor disk 202. In the example of FIG. 2E, the doped region 204 may be oval shaped or circular.

The absorption region 206 is positioned on or in the doped region 204. As seen in FIG. 2E, the absorption region 206 may be shaped as an arc within the doped region 204. Portions of the doped region 204 are positioned between the center of the semiconductor disk 202 and the absorption region 206 along a radius of the semiconductor disk 202. The absorption region 206 may be positioned along an inner circumference of the semiconductor disk 202. The absorption region 206 may absorb an optical signal that travels along the inner circumference of the semiconductor disk 202.

A metal contact 208 is formed on the doped region 204, and a metal contact 208 is formed on the absorption region 206. The metal contacts 208 allow for extraction of negatively charged electrons and positively charged holes from the doped region 204 and the absorption region 206 to produce an electric signal.

FIG. 2F illustrates an example configuration of the photodetector 102 in the system 100 of FIG. 1. FIG. 2F provides a top-down view of the photodetector 102. As seen in FIG. 2F, the photodetector 102 includes the semiconductor disk 202, the doped region 204, the absorption region 206, and metal contacts 208.

The doped region 204 may be an n-type doped region formed in or on the semiconductor disk 202. The doped region 204 may extend across a radial center of the semiconductor disk 202. As seen in FIG. 2F, the doped region 204 may be oval-shaped or circular.

The absorption region 206 may be positioned on or in the doped region 204. Portions of the doped region 204 are positioned between the center of the semiconductor disk 202 and the absorption region 206 along the semiconductor disk 202. As seen in FIG. 2F, the absorption region 206 may be shaped as a slice or a wedge of the doped region 204. The absorption region 206 may be positioned along an inner circumference of the semiconductor disk 202, and the absorption region 206 may absorb an optical signal traveling along the inner circumference of the semiconductor disk 202.

A metal contact 208 may be formed on the doped region 204, and a metal contact 208 may be formed on the absorption region 206. The metal contacts 208 allow for extraction of negatively charged electrons and positively charged holes from the doped region 204 and the absorption region 206 to produce an electric signal.

Figures 2G, 2H, 2I:
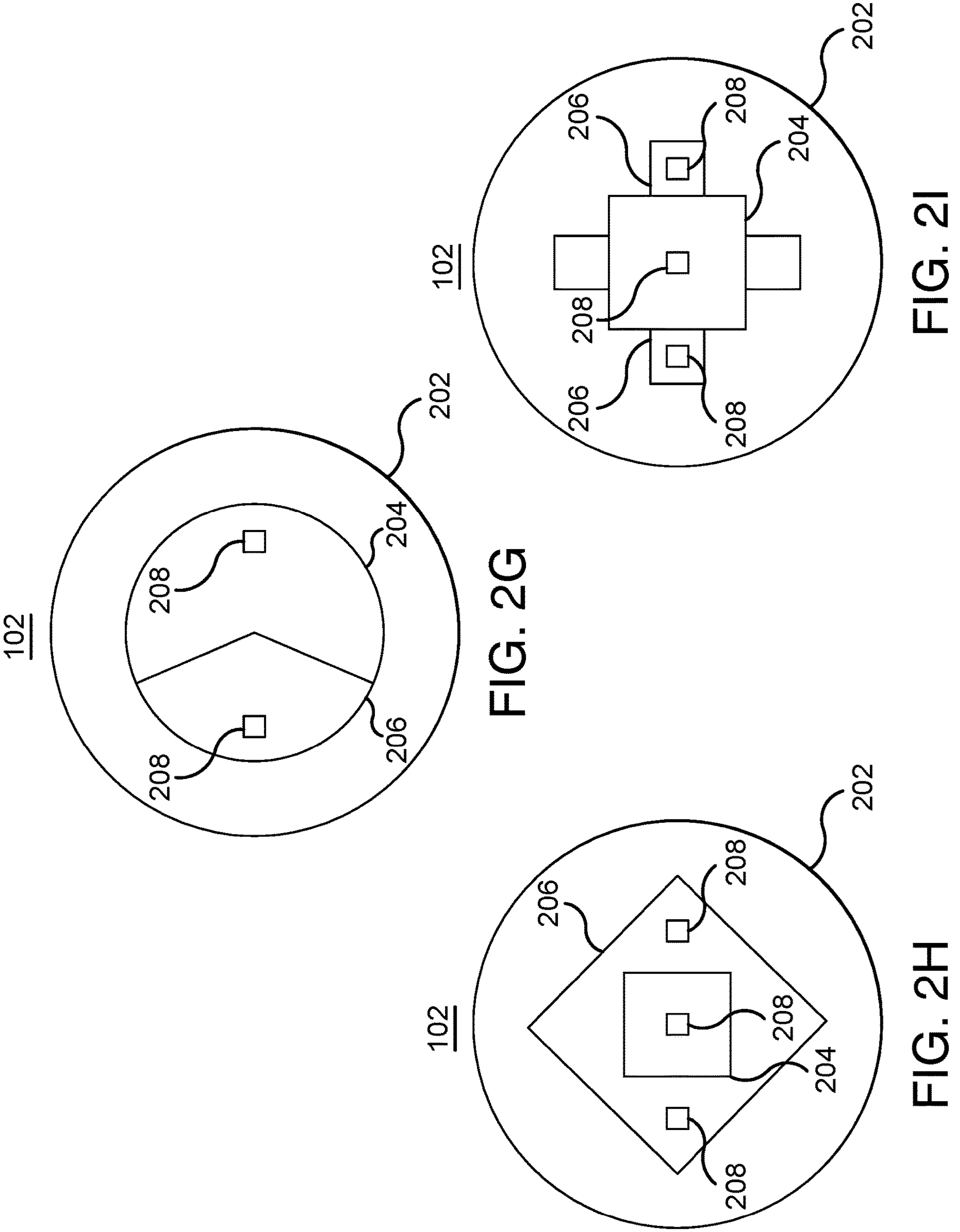

FIG. 2G illustrates an example configuration of the photodetector 102 in the system 100 of FIG. 1. FIG. 2G provides a top-down view of the photodetector 102. As seen in FIG. 2G, the photodetector 102 includes the semiconductor disk 202, the doped region 204, the absorption region 206, and metal contacts 208.

The doped region 204 may be an n-type doped region formed in or on the semiconductor disk 202. The doped region 204 may extend across a radial center of the semiconductor disk 202. As seen in FIG. 2G, the doped region 204 may be oval-shaped or circular.

The absorption region 206 may be positioned on or in the doped region 204. Portions of the doped region 204 may be positioned between the center of the semiconductor disk 202 and the absorption region 206 along a radius of the semiconductor disk 202. As seen in FIG. 2G, the absorption region 206 may be shaped as a slice or wedge of the doped region 204. The absorption region 206 may be positioned along an inner circumference of the semiconductor disk 202, and the absorption region 206 may absorb an optical signal traveling along the inner circumference of the semiconductor disk 202.

A metal contact 208 is formed on the doped region 204, and a metal contact 208 is formed on the absorption region 206. The metal contacts 208 allow for extraction of negatively charged electrons and positively charged holes from the doped region 204 and the absorption region 206 to produce an electric signal.

FIG. 2H illustrates an example configuration of the photodetector 102 in the system 100 of FIG. 1. FIG. 2H provides a top-down view of the photodetector 102. As seen in FIG. 2H, the photodetector 102 includes the semiconductor disk 202, the doped region 204, the absorption region 206, and the metal contacts 208.

The doped region 204 may be an n-type doped region formed in or on the semiconductor disk 202. The doped region 204 may extend across a radial center of the semiconductor disk 202. As seen in FIG. 2H, the doped region 204 may be square shaped or rectangular shaped.

The absorption regions 206 may be positioned on or in the doped region 204. Portions of the doped region 204 are positioned between the center of the semiconductor disk 202 and the absorption region 206 along a radius of the semiconductor disk 202. As see in FIG. 2H, the absorption region 206 may be diamond shaped, square shaped, or rectangular shaped. Thus, the portion of the doped region 204 may extend across the radial center of the semiconductor disk 202 and be exposed. The absorption region 206 may surround the portion of the doped region 204. The absorption region 206 may be positioned along an inner circumference of the semiconductor disk 202, and the absorption region 206 may absorb an optical signal traveling along the inner circumference of the semiconductor disk 202.

A metal contact 208 is formed on the doped region 204, and two metal contacts 208 are formed on the absorption region 206. The metal contacts 208 allow for extraction of negatively charged electrons and positively charged holes from the doped region 204 and the absorption region 206 to produce an electric signal.

FIG. 2I illustrates an example configuration of the photodetector 102 in the system 100 of FIG. 1. FIG. 2I provides a top-down view of the photodetector 102. As seen in FIG. 2I, the photodetector 102 includes the semiconductor disk 202, the doped region 204, the absorption regions 206, and the metal contacts 208.

The doped region 204 may be an n-type doped region formed in or on the semiconductor disk 202. The doped region 204 may extend across a radial center of the semiconductor disk 202. As seen in FIG. 2I, the doped region 204 may be square shaped or rectangular shaped.

The absorption regions 206 may be positioned on or in the doped region 204. Portions of the doped region 204 may be positioned between the center of the semiconductor disk 202 and the absorption regions 206 along the radius of the semiconductor disk 202. As seen in FIG. 2I, the absorption regions 206 may be square shaped or rectangular shaped. The absorption regions 206 may be formed on opposite sides of the doped region 204. The absorption regions 206 may be positioned along an inner circumference of the semiconductor disk 202, and the absorption regions 206 may absorb an optical signal traveling along the inner circumference of the semiconductor disk 202.

A metal contact 208 is formed on the doped region 204, and metal contacts 208 are formed on the absorption regions 206. The metal contacts 208 allow for extraction of negatively charged electrons and positively charged holes from the doped region 204 and the absorption regions 206 to produce an electric signal.

Figure 2J:
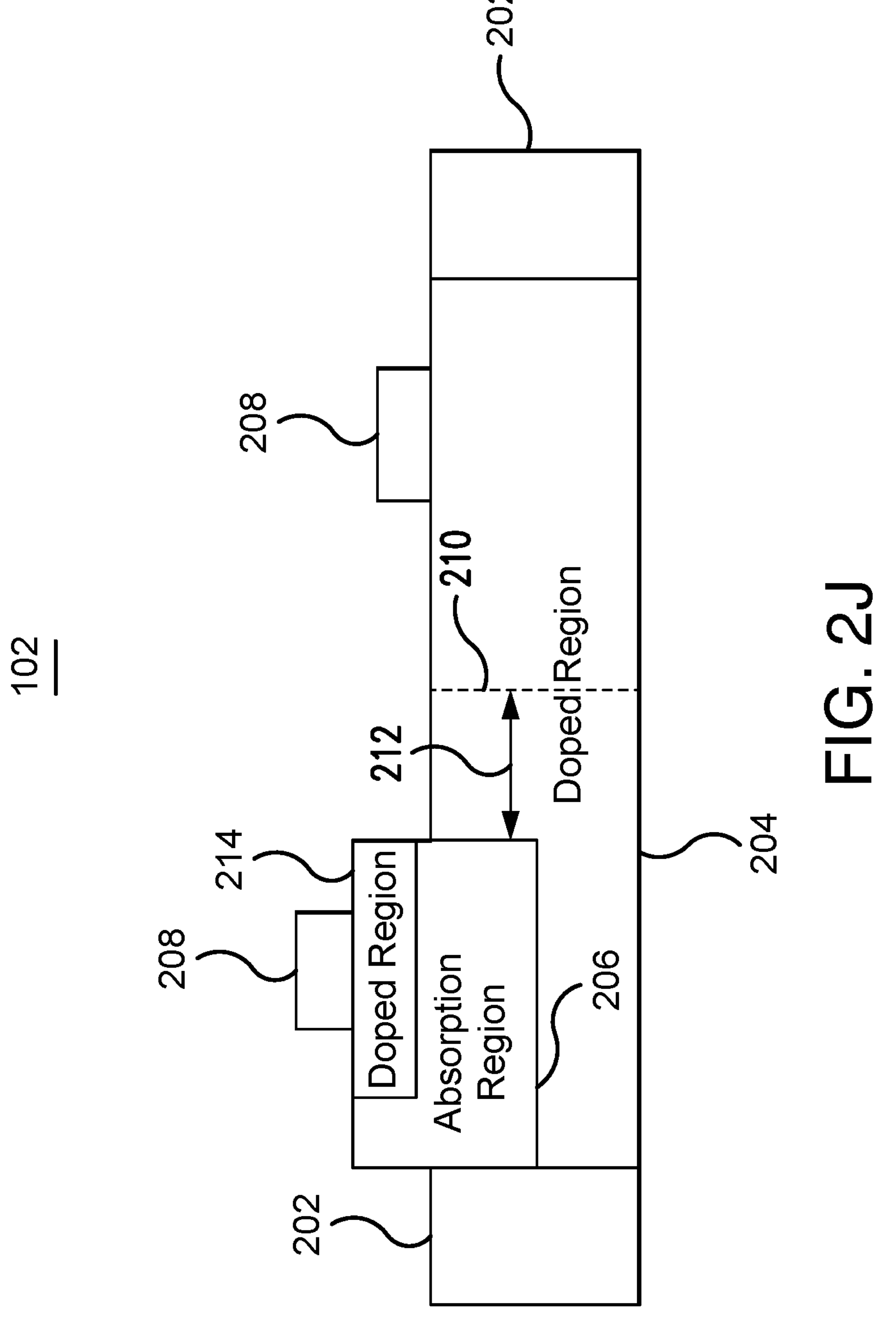

FIG. 2J illustrates an example configuration of the photodetector 102 in the system 100 of FIG. 1. FIG. 2J shows a cross-sectional view of the photodetector 102. Generally, the cross-sectional view shown in FIG. 2J may be applicable to the configurations of the photodetector 102 shown in FIGS. 2E, 2F, and 2G. As seen in FIG. 2J, the photodetector 102 includes the semiconductor disk 202, the doped region 204, the absorption region 206, and the metal contacts 208.

The doped region 204 is formed in or on the semiconductor disk 202. The doped region 204 may be an n-type doped region, and the doped region 204 may extend across a radial center of the semiconductor disk 202, indicated by the dashed line 210.

The absorption region 206 is formed on or in the doped region 204. As seen in FIG. 2J, portions of the doped region 204 are positioned between the center of the semiconductor disk 202 and the absorption region 206 along a radius of the semiconductor disk 202, indicated by the line 212. Thus, portions of the doped region 204 are radially central relative to the absorption region 206.

The absorption region 206 may include a doped region 214. The doped region 214 may have an opposite doping type relative to the doped region 204. For example, the doped region 214 may be a p-type doped region. The doped region 214 may be formed by doping the absorption region 206. In embodiments where the absorption region 206 includes germanium, the doped region 214 includes doped germanium.

A metal contact 208 is formed on the doped region 204, and a metal contact 208 is formed on the doped region 214 of the absorption region 206. The metal contacts 208 allow for extraction of negatively charged electrons and positively charged holes from the doped region 204 and the absorption region 206 to produce an electric signal.

Figures 2K, 2L:
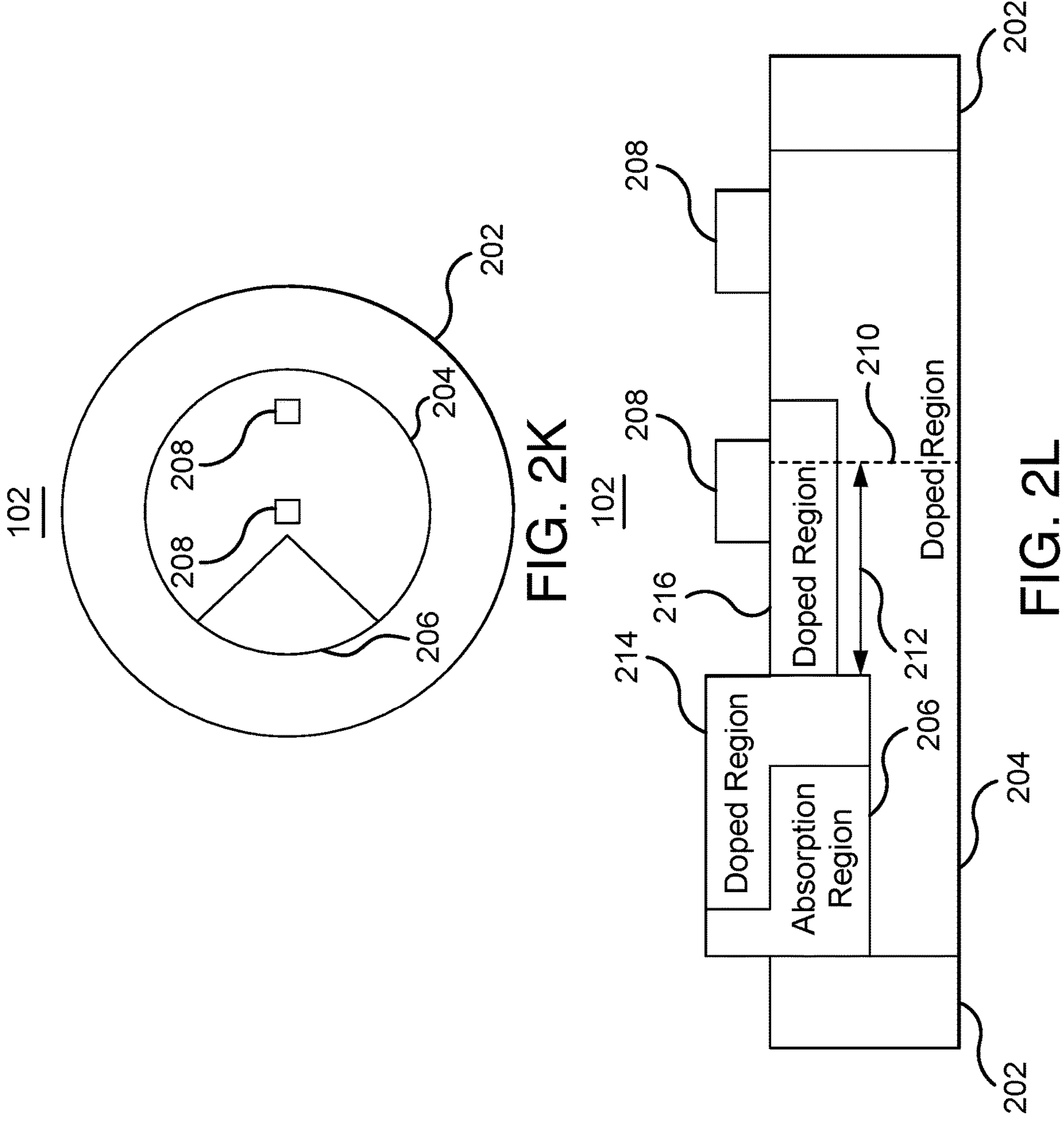

FIG. 2K illustrates an example configuration of the photodetector 102 in the system 100 of FIG. 1. FIG. 2K provides a top-down view of the photodetector 102. As seen in FIG. 2K, the photodetector 102 includes the semiconductor disk 202, the doped region 204, the absorption region 206, and the metal contacts 208.

The doped region 204 may be an n-type doped region formed in or on the semiconductor disk 202. The doped region 204 may extend across a radial center of the semiconductor disk 202. As seen in FIG. 2K, the doped region 204 may be oval shaped or circular.

The absorption region 206 is positioned on or in the doped region 204. Portions of the doped regions 204 may be positioned between the center of the semiconductor disk 202 and the absorption region 206 along a radius of the semiconductor disk 202. As see in FIG. 2K, the absorption region may be shaped as a slice or wedge of the doped region 204. The absorption region 206 may be positioned along an inner circumference of the semiconductor disk 202, and the absorption region 206 may absorb an optical signal traveling along the inner circumference of the semiconductor disk 202.

The metal contacts 208 are formed on the doped region 204. The metal contacts 208 may allow for extraction of negatively charged electrons and positively charged holes from the doped region 204 and the absorption region 206 to produce an electric signal.

FIG. 2L illustrates an example configuration of the photodetector 102 in the system 100 of FIG. 1. FIG. 2L provides a cross-sectional view of the photodetector 102. The cross-sectional view shown in FIG. 2L may be applicable to the configuration of FIG. 2K. As seen in FIG. 2L, the photodetector 102 includes the semiconductor disk 202, the doped region 204, the absorption region 206, and the metal contacts 208.

The doped region 204 may be an n-type doped region formed in or on the semiconductor disk 202. The doped region 204 extends across a radial center of the semiconductor disk 202, indicated by the dash line 210.

The absorption region 206 is positioned on or in the doped region 204. Portions of the doped region 204 are positioned between the center of the semiconductor disk 202 and the absorption region 206 along a radius of the semiconductor disk 202, indicated by the line 212. The absorption region may include a doped region 214. The doped region 214 may have an opposite doping type relative to the doped region 204. For example, the doped region 214 may have a p-type doping. In embodiments where the absorption region 206 includes germanium, the doped region 214 includes doped germanium.

The metal contacts 208 are formed on the doped region 204 to allow for electric current to flow from the absorption region 206 to the metal contacts 208. The doped region 204 includes a doped region 216. The doped region 216 may have an opposite doping type relative to the doped region 204. For example, the doped region 216 may be a p-type doped region. The doped region 214 may contact the doped region 216. Additionally, the metal contact 208 may be formed on the doped region 216, and the metal contact 208 may extend across a center of the semiconductor disk 202. Thus, the doped region 216 allows for electric current to flow from the absorption region 206 to the metal contact 208 through the doped region 214.

Figure 2M:
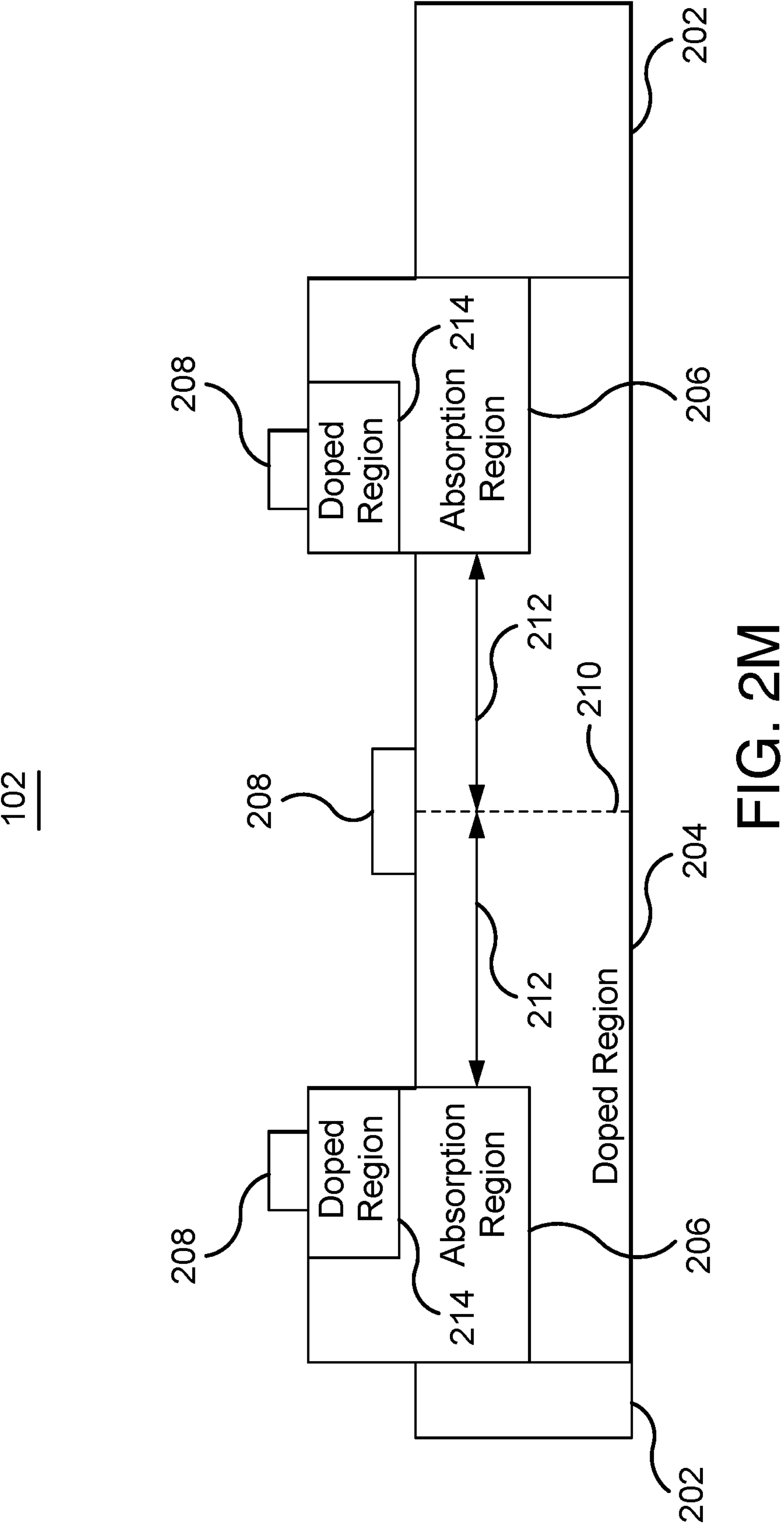

FIG. 2M illustrates an example configuration of the photodetector 102 in the system 100 of FIG. 1. FIG. 2M provides a cross-sectional view of the photodetector 102. The cross-sectional view shown in FIG. 2M may apply to the configurations shown in FIGS. 2A, 2B, 2C, 2D, 2H, and 2I. As seen in FIG. 2M, the photodetector 102 includes the semiconductor disk 202, the doped region 204, the absorption regions 206, and the metal contacts 208.

The doped region 204 may be an n-type doped region formed in or on the semiconductor disk 202. The doped region 204 may extend across a radial center of the semiconductor disk 202, indicated by the dash line 210.

The absorption regions 206 are positioned on or in the doped region 204. Portions of the doped region 204 are positioned between the center of the semiconductor disk 202 and the absorption regions 206 along radii of the semiconductor disk 202, indicated by the lines 212. The absorption regions 206 also include the doped regions 214. The doped regions 214 may have an opposite doping type relative to the doped region 204. For example, the doped regions 214 may be p-type doped regions. In embodiments where the absorption region 206 includes germanium, the doped region 214 includes doped germanium.

The metal contacts 208 are formed on the doped regions 204 and the absorption regions 206. For example, a metal contact 208 may be formed on the doped region 204, and two metal contacts 208 are formed on the doped regions 214. The metal contacts 208 allow for extraction of negatively charged electrons and positively charged holes from the doped region 204 and the absorption region 206 to produce an electric signal.

Figure 3A:
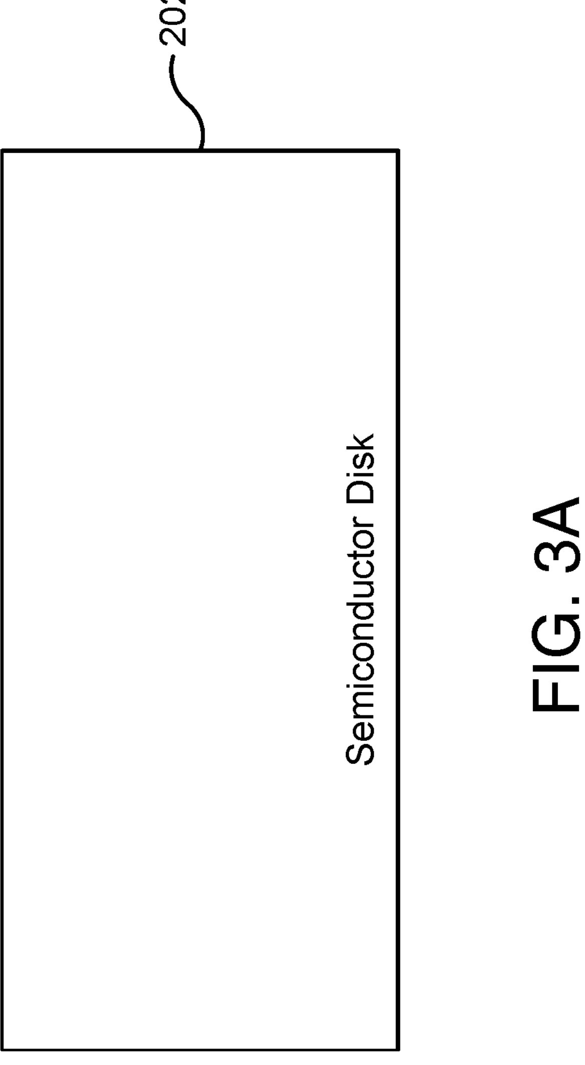
FIGS. 3A through 3F illustrate an example process for forming the photodetector in the system of FIG. 1.
Figure 3B:
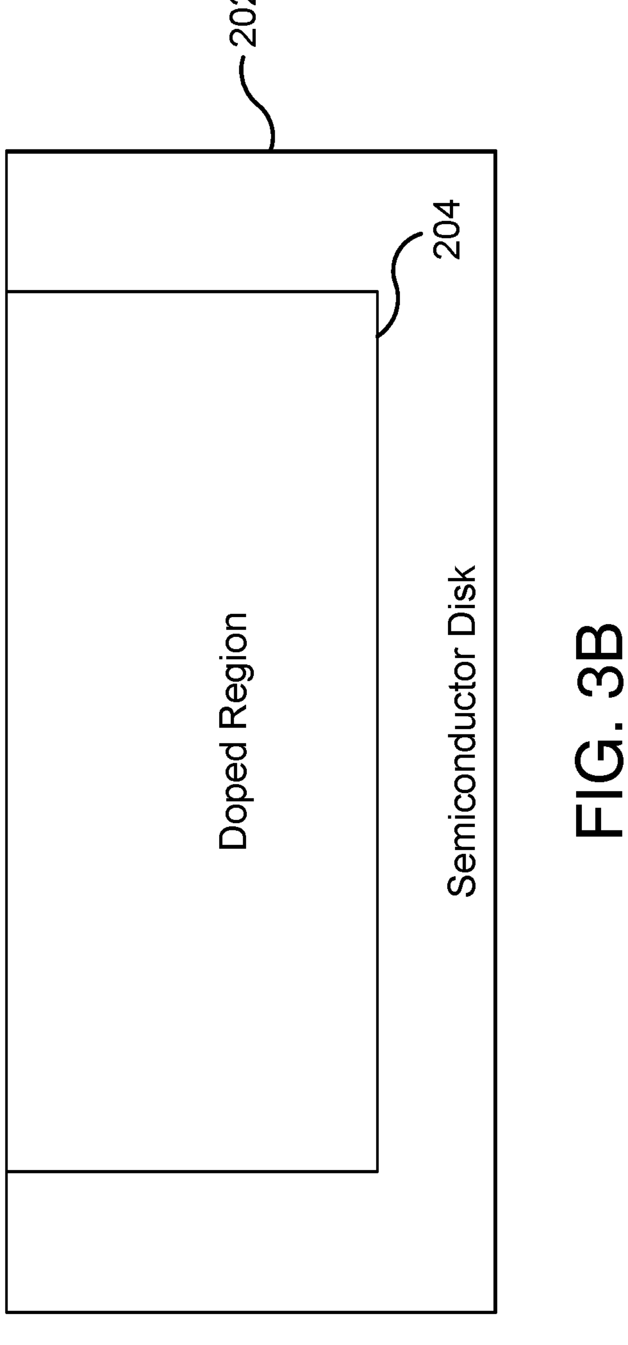
Figure 3C:
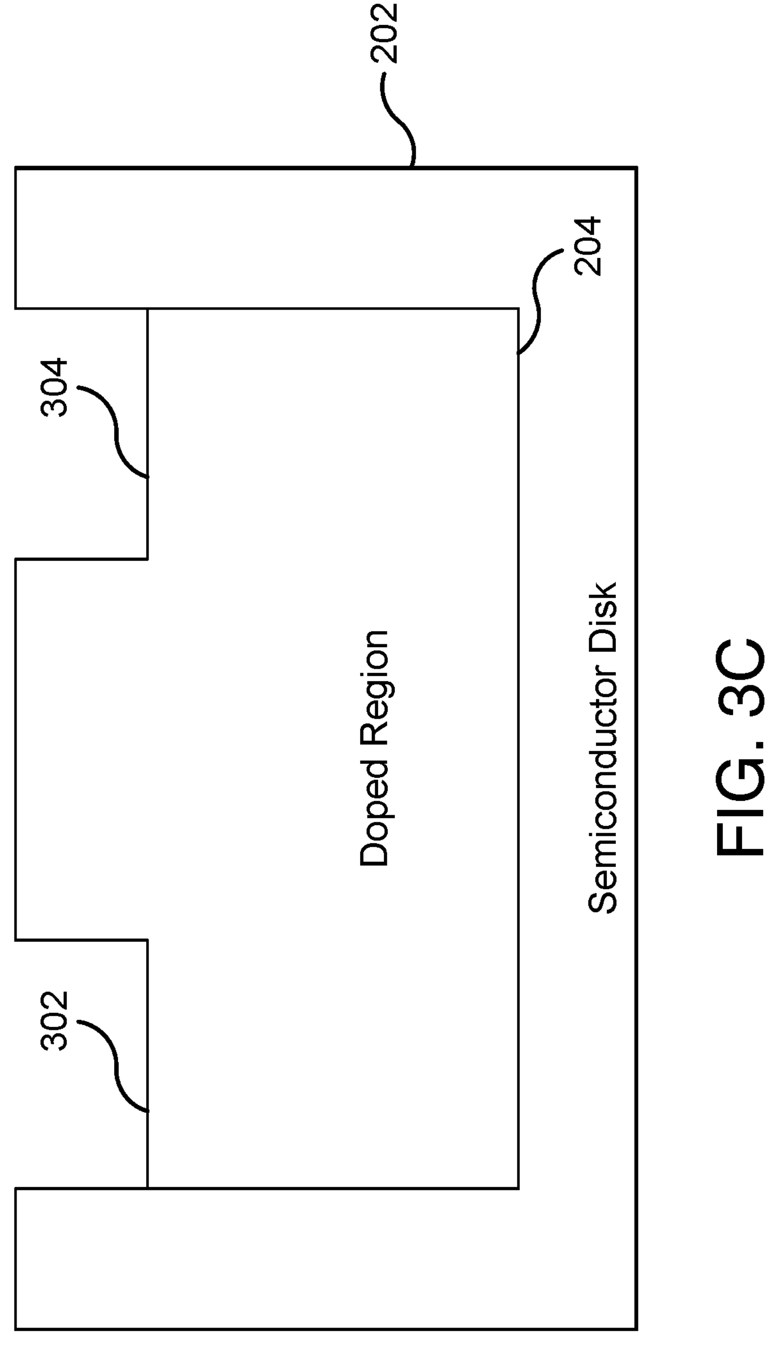

FIGS. 3A through 3F illustrate an example process for forming the photodetector 102 in the system 100 of FIG. 1. As seen in FIG. 3A, the process begins with the semiconductor disk 202. FIG. 3A shows a cross-sectional view of the semiconductor disk 202, which may be a silicon disk. As seen in FIG. 3B, the semiconductor disk 202 is doped to form the doped region 204 in the semiconductor disk 202. For example, the doped region 204 may be an n-type doped region formed in or on the semiconductor disk 202. As seen in FIG. 3C, the doped region 204 is etched to form one or more cavities in the doped region 204. In the example of FIG. 3C, the doped region 204 is etched to form the cavity 302 and the cavity 304. In some embodiments, only the cavity 302 is formed in the doped region 204.

Figure 3D:
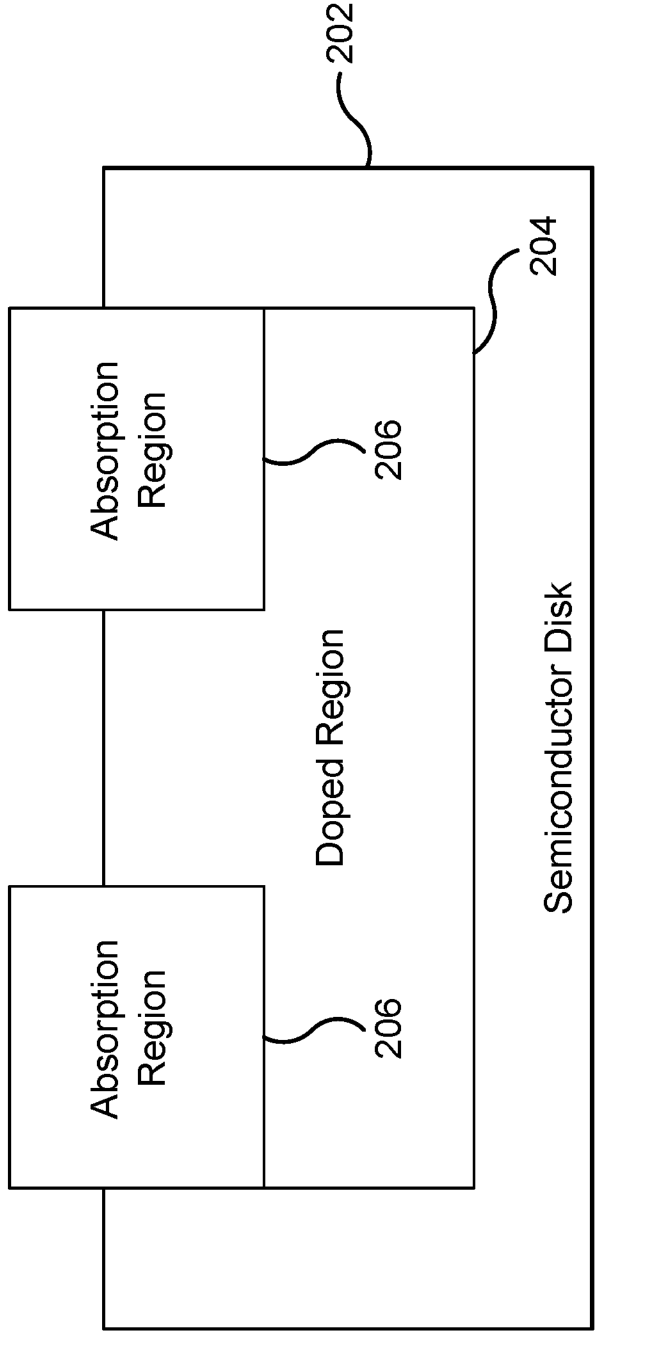

As seen in FIG. 3D, the absorption regions 206 are positioned on or in the doped region 204. Specifically, the absorption regions 206 may be positioned on or in the cavities 302 and 304. In embodiments where only one cavity 302 is formed in the doped region 204, only one absorption region 206 may be positioned on or in the cavity 302. In some embodiments, the absorption regions 206 include germanium. Portions of the doped regions 204 are positioned between the absorption regions 206 and a center of the semiconductor disk 202 along a radius of the semiconductor disk 202. Additionally, the absorption regions 206 may be positioned along an inner circumference of the semiconductor disk 202, and the absorption regions 206 may absorb an optical signal traveling along the inner circumference of the semiconductor disk 202.

Figure 3E:
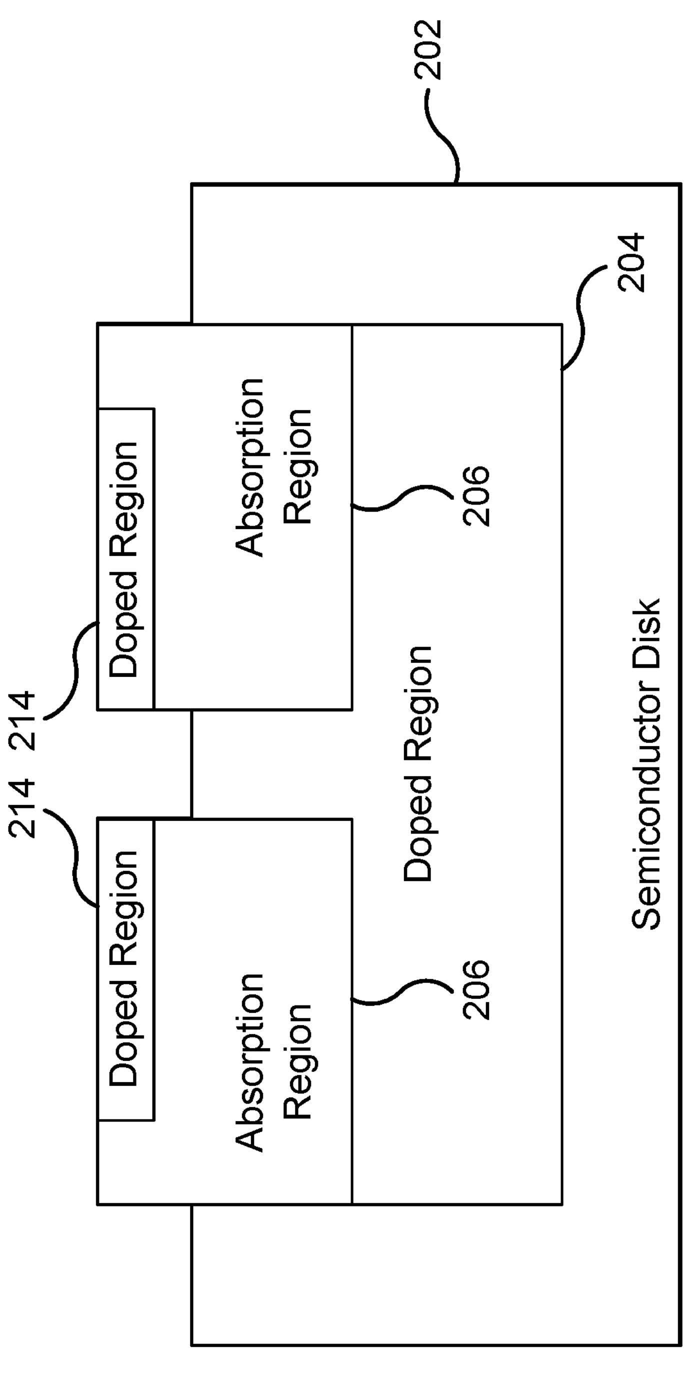

As seen in FIG. 3E, doped regions 214 are formed in the absorption regions 206. For example, a doping process may be performed to dope the absorption regions 206 to form the doped regions 214. The doped regions 214 may have an opposite doping type relative to the doped region 204. For example, the doped regions 214 may be p-type doped regions, while the doped region 204 may be an n-type doped region. In embodiments where the absorption region 206 includes germanium, the doped region 214 includes doped germanium.

Figure 3F:
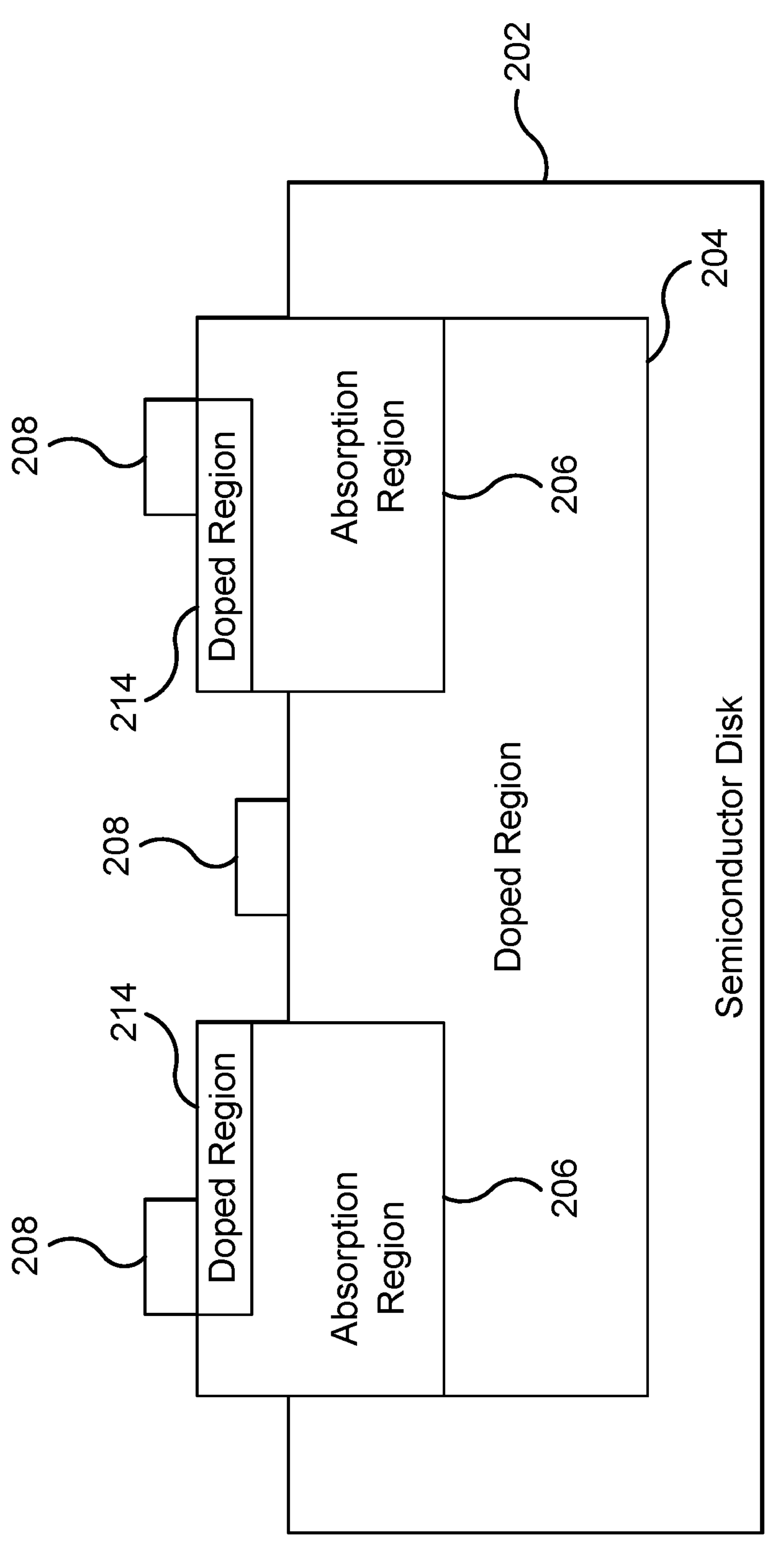

As seen in FIG. 3F, metal contacts 208 are formed on the doped region 204 and the doped regions 214. For example, a metal contact 208 is formed on the doped region 204, and metal contacts are formed on each of the doped regions 214. The metal contacts 208 allow for extraction of negatively charged electrons and positively charged holes from the doped region 204 and the absorption regions 206 to produce an electric signal. In embodiments where the metal contacts 208 are formed on the doped region 204, the doped region 204 may be doped again with an opposite doping type (e.g., a p-type doping) to create an additional doped region (e.g., the doped region 216 shown in FIG. 2L) that contacts the doped region 214 in the absorption region 206. One of the metal contacts 208 may then be formed on this additional doped region.

Any suitable doping type may be used to form the doped regions 204, 214, and 216. For example, the doped region 204 may be an n-type doped region, and the doped regions 214 and 216 may be p-type doped regions. As another example, the doped region 204 may be a p-type doped region, and the doped regions 214 and 216 may be n-type doped regions.

In summary, the photodetector 102 includes a pie arrangement. An optical signal may couple into the photodetector 102 (e.g., directly or evanescently) and travel around an inner circumference 106 of the photodetector 102. One or more absorption regions 206 are positioned along the inner circumference 106 and absorb the optical signal as the optical signal travels around the inner circumference 106. In certain embodiments, this structure allows the photodetector 102 to support higher bandwidths in an optical transceiver.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s).

In view of the foregoing, the scope of the present disclosure is determined by the claims that follow.

We claim:

1. An apparatus comprising:

a semiconductor disk;

a first doped region disposed within the semiconductor disk such that the first doped region extends across a center of the semiconductor disk, wherein the first doped region has a first doping type; and a first absorption region disposed on the first doped region such that a portion of the first doped region is positioned between the center of the semiconductor disk and the first absorption region along a radius of the semiconductor disk, wherein the first absorption region extends around a periphery of an exposed portion of the first doped region that extends across a radial center of the semiconductor disk, wherein the first absorption region comprises a second doped region with a second doping type different from the first doping type, and wherein the first absorption region is arranged to absorb an optical signal as the optical signal travels along an inner circumference of the semiconductor disk.

2. The apparatus of claim 1, further comprising a first metal contact disposed on the first doped region.

3. The apparatus of claim 2, further comprising a second metal contact disposed on the second doped region.

4. The apparatus of claim 2, further comprising:

a third doped region disposed in the first doped region and contacting the second doped region, wherein the third doped region has the second doping type; and a second metal contact disposed on the third doped region.

5. The apparatus of claim 4, wherein the second metal contact extends across the center of the semiconductor disk.

6. The apparatus of claim 1, wherein the first absorption region comprises germanium, and wherein the second doped region comprises doped germanium.

7. The apparatus of claim 1, further comprising a second absorption region disposed on the first doped region such that a portion of the first doped region is positioned between the center of the semiconductor disk and the second absorption region along a radius of the semiconductor disk, wherein the second absorption region comprises a third doped region with the second doping type, and wherein the second absorption region is arranged to absorb the optical signal as the optical signal travels along the inner circumference of the semiconductor disk.

8. The apparatus of claim 7, wherein the first absorption region is positioned on a first side of the first doped region, and wherein the second absorption region is positioned on a second side of the first doped region opposite the first side.

9. The apparatus of claim 7, further comprising:

a first metal contact positioned on the first doped region;

a second metal contact positioned on the second doped region; and a third metal contact positioned on the third doped region.

10. An apparatus comprising:

a semiconductor disk;

a doped region disposed within the semiconductor disk such that the doped region extends across a center of the semiconductor disk;

a first absorption region disposed on a first side of the doped region, wherein the first absorption region extends around a periphery of an exposed portion of the doped region that extends across a radial center of the semiconductor disk; and a second absorption region disposed on a second side the doped region that is opposite the first side such that the doped region is positioned between the first absorption region and the second absorption region along a radial direction of the semiconductor disk, wherein the first and second absorption regions are arranged to absorb an optical signal as the optical signal travels along an inner circumference of the semiconductor disk.

* * * * *